United States Patent
Brochhaus

(10) Patent No.: US 9,987,943 B2
(45) Date of Patent: Jun. 5, 2018

(54) METHOD FOR TRANSMITTING DATA IN A BATTERY MANAGEMENT SYSTEM

(71) Applicant: Robert Bosch GmbH, Stuttgart (DE)

(72) Inventor: Christoph Brochhaus, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 41 days.

(21) Appl. No.: 14/915,831

(22) PCT Filed: Aug. 29, 2014

(86) PCT No.: PCT/EP2014/068326
§ 371 (c)(1),
(2) Date: Mar. 1, 2016

(87) PCT Pub. No.: WO2015/028584
PCT Pub. Date: Mar. 5, 2015

(65) Prior Publication Data
US 2016/0193936 A1    Jul. 7, 2016

(30) Foreign Application Priority Data
Sep. 2, 2013    (DE) .................. 10 2013 217 451

(51) Int. Cl.
*B60L 11/18*    (2006.01)
*G01R 31/36*    (2006.01)
(Continued)

(52) U.S. Cl.
CPC ......... *B60L 11/1861* (2013.01); *B60L 11/187* (2013.01); *B60L 11/1857* (2013.01);
(Continued)

(58) Field of Classification Search
CPC .................. G01R 31/3648; H01M 10/425
See application file for complete search history.

(56) References Cited

U.S. PATENT DOCUMENTS 5,940,757 A * 8/1999 Callaway, Jr. ......... H04W 48/18
340/7.45
2007/0145948 A1 * 6/2007 Lim ................... B60L 11/1887
320/132
(Continued)

FOREIGN PATENT DOCUMENTS

DE    102009027177 A1    12/2010
DE    102010038860 A1    2/2012
(Continued)

OTHER PUBLICATIONS

International Search Report for Application No. PCT/EP2014/068326 dated Mar. 17, 2015 (English Translation, 3 pages).
(Continued)

*Primary Examiner* — Kimberly S Berona
*Assistant Examiner* — Rodney P King
(74) *Attorney, Agent, or Firm* — Michael Best & Friedrich LLP

(57) ABSTRACT

The invention relates to a method for transmitting data in a battery management system (1) having at least one main control device (2) and a number of module control devices (6-1, 6-2, . . . , 6-n) which transmit measurement values to the main control device (2) via a communications channel (5). One of the module control devices (6-1, 6-2, . . . , 6-n) is a reference module control device. The method comprises the method steps: a) the reference module control device transmits a reference measurement value on the communications channel (5), b) the module control devices (6-1, 6-2, . . . , 6-n) determine differential values of their own measurement values to the reference measurement value, c) the module control devices (6-1, 6-2, . . . , 6-n) transmit the differential values of their own measurement values to the reference measurement value on the communications channel (5) and d) the main control device (2) reconstructs the measurement values of the module control devices (6-1,
(Continued)

6-2, ..., 6-n) using the differential values and the reference measurement value. A computer program, a battery management system (1) and a battery which are designed to carry out the method are also described.

14 Claims, 4 Drawing Sheets

(51) Int. Cl.
    *H01M 10/42* (2006.01)
    *H01M 10/48* (2006.01)
    *H04L 12/12* (2006.01)

(52) U.S. Cl.
    CPC ....... *B60L 11/1864* (2013.01); *B60L 11/1866* (2013.01); *G01R 31/3658* (2013.01); *H01M 10/4207* (2013.01); *H01M 10/482* (2013.01); *H04L 12/12* (2013.01); *B60L 2240/545* (2013.01); *B60L 2240/547* (2013.01); *B60L 2240/549* (2013.01); *H01M 10/486* (2013.01); *H01M 2010/4271* (2013.01); *H01M 2010/4278* (2013.01); *H01M 2220/20* (2013.01); *Y02B 60/34* (2013.01); *Y02T 10/7005* (2013.01); *Y02T 10/7061* (2013.01); *Y02T 90/16* (2013.01)

(56) References Cited

U.S. PATENT DOCUMENTS

| | | | |
|---|---|---|---|
| 2008/0238371 A1 | 10/2008 | Tamezane | |
| 2009/0234538 A1* | 9/2009 | Ta | B62D 5/046 |
| | | | 701/41 |
| 2010/0019732 A1 | 1/2010 | Utsumi et al. | |
| 2010/0138178 A1 | 6/2010 | Paryani et al. | |
| 2010/0190041 A1* | 7/2010 | Hou | H01M 10/482 |
| | | | 429/50 |
| 2011/0234167 A1 | 9/2011 | Kao et al. | |
| 2012/0072145 A1 | 3/2012 | Zhang et al. | |
| 2012/0290234 A1 | 11/2012 | Schaefer | |
| 2013/0181513 A1 | 7/2013 | Yano | |
| 2014/0346982 A1* | 11/2014 | Brochhaus | G06F 21/64 |
| | | | 318/139 |
| 2014/0350876 A1* | 11/2014 | Brochhaus | G01R 31/3651 |
| | | | 702/63 |

FOREIGN PATENT DOCUMENTS

| | | |
|---|---|---|
| DE | 102010038886 | 2/2012 |
| DE | 102011085787 | 5/2013 |
| DE | 102012211120 A1 | 1/2014 |
| EP | 2385604 A1 | 11/2011 |
| EP | 2595218 | 5/2013 |
| KR | 100680901 | 2/2007 |
| KR | 20100067363 A | 6/2010 |
| KR | 20130033197 A | 4/2013 |
| WO | 0221662 A2 | 3/2002 |

OTHER PUBLICATIONS

International Written Opinion for Application No. PCT/EP2014/068326 dated Mar. 17, 2015 (English Translation and Original, 14 pages).

* cited by examiner

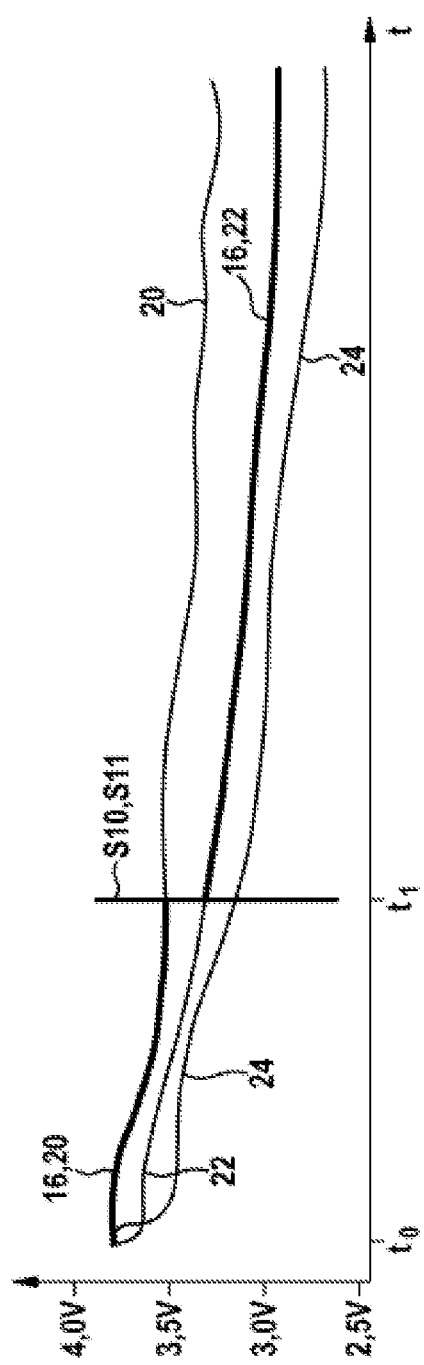

METHOD FOR TRANSMITTING DATA IN A BATTERY MANAGEMENT SYSTEM

BACKGROUND OF THE INVENTION

The invention relates to a method for transmitting data in a battery management system having at least one main control device and a number of module control devices which transmit measured values to the main control device via a communications channel.

The invention also relates to a computer program, a battery management system and a battery which are set up to carry out the method.

Electronic control devices are nowadays used in increasing numbers in the automotive sector. Examples are engine control devices and control devices for ABS or the airbag. For electrically driven vehicles, a contemporary research focus is the development of powerful battery packs with associated battery management systems, that is to say control devices which are equipped with software for monitoring the battery functionality. Battery management systems ensure, inter alia, the safe and reliable operation of the battery cells and battery packs used. They monitor and control currents, voltages, temperatures, insulation resistances and further variables for individual cells and/or the entire battery pack. Management functions which increase the service life, reliability and safety of the battery system can be implemented with the aid of these variables.

Battery management systems consist of a multiplicity of control devices on which individual software functionalities run. In this case, depending on the number of battery cells, the number of sensors and the distribution of the battery modules to different installation spaces in the vehicle, a control device topology having a main control device and a plurality of subordinate module control devices for recording the measurement data directly at the individual battery modules results. The recorded data are interchanged between the control devices via a communications channel. Measurement data are communicated at a high frequency to the main control device on the communications channel by using a large number of battery modules and associated module control devices. The measurement frequency is generally restricted by properties of the communications channel, for example a bandwidth on a data bus, and by the number of battery modules.

US 2010/0019732 A1 describes a battery management system having a main control device and a plurality of battery units, one battery unit determining a reference measured value which changes on the basis of predetermined criteria without the influence of the main control device.

KR10/0680901 shows a battery management system comprising a main control device and a plurality of module control devices, the module control devices determining and providing cell voltages and temperatures. The main control device makes it possible to carry out so-called battery balancing if a difference between the cell voltage and a reference measured value assumes a defined critical value.

SUMMARY OF THE INVENTION

A method according to the invention for transmitting data in a battery management system having at least one main control device and a number of module control devices which transmit measured values to the main control device via a communications channel, one of the module control devices being a reference module control device, comprises the following method steps:

a) the reference module control device transmits a reference measured value on the communications channel, b) the module control devices determine differential values of their own measured values with respect to the reference measured value, c) the module control devices transmit the differential values of their own measured values with respect to the reference measured value on the communications channel, and d) the main control device reconstructs the module control devices' measured values using the differential values and the reference measured value.

Use is advantageously made of the fact that the range of values of the differences between measured values and the reference measured value is smaller than the range of values of the measured values. A relatively small proportion of the communications channel is therefore used.

One advantage of the method according to the invention is that, for given properties of the communications channel, for example with a fixed bandwidth of the data bus, the maximum number of module control devices can be increased, with the result that more battery modules can communicate via the communications channel without interference.

On the other hand, the improved communication makes it possible to alternatively or additionally change the properties of the communications channel; for example, a bus having a relatively narrow bandwidth can be used to transmit the measured values to the main control device. This is because a smaller range of values of the differential values can be converted into a relatively small number of communication bits on the communications channel, for example by means of suitable data structures. A narrower bandwidth reduces the likelihood of interference, for example caused by EMC irradiation.

Another advantage of the method according to the invention is that it operates without losses, that is to say the measurement accuracy is not restricted in comparison with conventional transmission of the measurement data.

Since one of the module control devices is declared to be the reference module control device and determines the reference measured value, the main control device is freed from the definition of reference measured values. The module control devices calculate their deviations, that is to say differential values, from the reference measured value, and the main control device is able to determine the measured value from the corresponding module control device from the differential values and the reference measured value.

According to one preferred embodiment, after expiry of a particular time, the reference module control device is newly selected from the group of module control devices. This advantageously takes into account the fact that the battery cells and battery modules are discharged at different speeds owing to ageing and an imbalance in the states of charge and possibly also temperatures therefore exists inside the battery pack. As a result of the fact that the reference module control device is newly determined after expiry of the particular time, prerequisites are created, whereby the reference measured values may be in the vicinity of the measured values from the battery modules and the reference measured values remain small. The check is carried out, for example, after each driving cycle, after a defined number of operating hours of the battery, after a defined number of days or in a manner triggered by an event, for example general battery balancing during which the states of charge of the battery cells are balanced.

Provision may be made for the reference module control device to be randomly newly selected from the group of module control devices after the expiry of the particular time. However, provision is preferably made for the reference module control device to be newly selected from the group of module control devices after determining a deviation state. One preferred embodiment therefore provides for the states of the module control devices to be regularly checked after expiry of a particular time and for the reference module control device to be newly selected only if a deviation state of the reference module control device with respect to the state of the group of module control devices is determined.

According to one preferred embodiment, the deviation state is determined by the reference module control device. This reduces the amount of computing by the main control device. It is particularly advantageous for the main control device to function as a pure data sink in this case and for it to receive and have to process only the measured values in the form of a reference measured value and numerous differential values.

For example, the deviation state is determined by comparing the reference measured value with a mean value determined from the measured values from all module control devices. It is therefore possible to take into account the fact that, after a certain time, a more favorable reference measured value than the previous reference measured value is available since the average deviation of all measured values from the mean value from another module control device is lower than the average deviation of all measured values from the mean value from the old reference module control device. From this time on, the other module control device is advantageously selected as the new reference module control device.

According to one preferred embodiment, a respective current reference module control device selects the new reference module control device. The module control devices determine the reference module control devices autonomously. This reduces the amount of computing by the main control device. The main control device is therefore not burdened with the definition of suitable reference measured values, but rather this task is undertaken by the current reference module control device. When starting the system, the module control device having the lowest identification number can be defined as the reference module control device, for example.

Reference measured values can be determined by averaging stored measured values from the reference module control device or by means of a current measured value from the reference module control device. The reference measured values and measured values transmitted in the method according to the invention may be any desired measured values, in principle. Characteristics of cell voltages and temperatures can be used in a particularly advantageous manner. Since all cell voltages are usually at the same voltage level in a battery pack, a reference measured value and the deviation of all cell voltages from this reference measured value suffice to carry out the management functions. The situation is similar with cell temperatures. The range of values of the differences is smaller than the range of values of the complete values and therefore occupies less bandwidth on the communications channel. The method can be applied to any desired measured values provided that they have similar behaviors to voltages and temperatures. Further measurement data which are usually recorded and transmitted by module control devices comprise, for example, the temperature, the insulation resistance, the state of charge, the emitted current or the provided voltage of the module. Measurement data may likewise comprise variables derived from such variables, for example temporally added or integrated variables, variables multiplied by one another or variables aggregated in another manner. In addition, differential values between minimum and maximum states, for example states of charge, relative battery powers or the number of times charging and discharging cycles are carried out may be included in the derived measurement data. Such measurement data are used to implement battery management functions, for example the determination of a likely service life of the battery system or a state of health (SOH) of the battery.

The invention also proposes a computer program, according to which one of the methods described herein is carried out when the computer program is executed on a programmable computer device. The computer program may be, for example, a module for implementing a device for providing measurement data for a battery management system and/or a module for implementing a battery management system of a vehicle. The computer program may be stored on a machine-readable storage medium, for instance on a permanent or rewritable storage medium or in association with a computer device, for example on a portable memory such as a CD-ROM, a DVD, a USB stick or a memory card. Additionally or alternatively, the computer program may be provided on a computer device, for instance on a server or a cloud server, for downloading, for example via a data network such as the Internet, or a communication connection, for instance a telephone line or a wireless connection.

The invention also provides a battery management system (BMS) having at least one main control device and a number of module control devices which transmit measured values to the main control device via a communications channel. In this case, provision is made for one of the module control devices to be a reference module control device. The module control devices have units for determining and transmitting differential values of their own measured values with respect to reference measured values from the reference module control device, and the main control device has a unit for determining the module control devices' measured values using the reference measured values and the differential values. The module control devices also have units for determining deviation states of their own measured values with respect to reference measured values. The module control devices preferably also have units for determining and selecting a new reference module control device.

The invention also provides a battery, in particular a lithium ion battery or a nickel metal hydride battery, which comprises a battery management system and can be connected to a drive system of a motor vehicle, the battery management system being designed and/or set up to carry out the method according to the invention, as described above.

In the present description, the terms "battery" and "battery unit" are used in a manner adapted to the conventional linguistic usage for rechargeable battery and rechargeable battery unit.

The battery preferably comprises one or more battery units which may comprise a battery cell, a battery module, a module string or a battery pack. In this case, the battery cells are preferably spatially combined and connected to one another using circuitry, for example are connected in series or parallel to form modules. A plurality of modules may form so-called battery direct converters (BDC) and a plurality of battery direct converters may form a battery direct inverter (BDI).

The invention also provides a motor vehicle having such a battery, the battery being connected to a drive system of the motor vehicle. The method is preferably used in electrically driven vehicles in which a multiplicity of battery cells are interconnected in order to provide the necessary drive voltage.

BRIEF DESCRIPTION OF THE DRAWINGS

Exemplary embodiments of the invention are illustrated in the drawings and are explained in more detail in the following description.

In the drawings:

FIG. 4 shows a graph with a temporal profile of voltage values from different battery cells.

DETAILED DESCRIPTION

Figure 1:
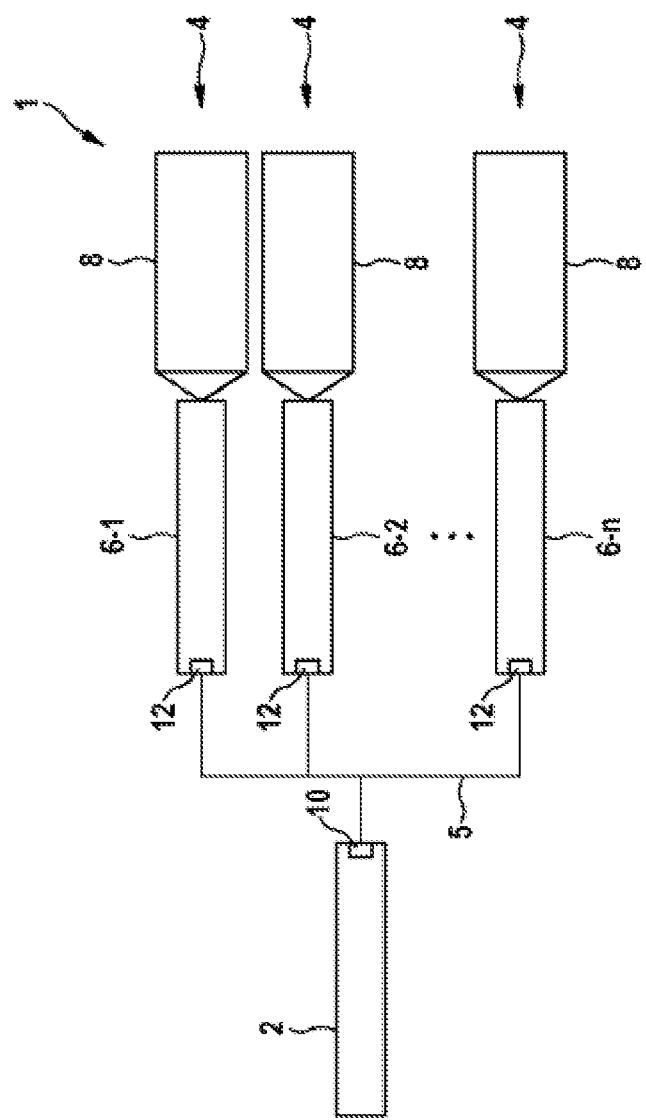
FIG. 1 shows a battery management system.

The battery management system 1 in FIG. 1 comprises a central control device 2, which can also be referred to as a BCU (Battery Control Unit), and a number of battery modules 4 each having their own module control devices 6-1, 6-2, . . . 6-n which are also referred to as a CMC (Cell Module Controller). Battery units 8 usually having a plurality of battery cells are assigned to each battery module 4, these battery units being connected in series and partially additionally in parallel in order to achieve the required power and energy data using the battery system. The individual battery cells are, for example, lithium ion batteries with a voltage range of 2.8 to 4.2 volts. Communication between the central control device 2 and the module control devices 6-1, 6-2, . . . 6-n is effected via a communications channel 5, for example via a CAN bus, and suitable interfaces 10, 12.

Figure 2:
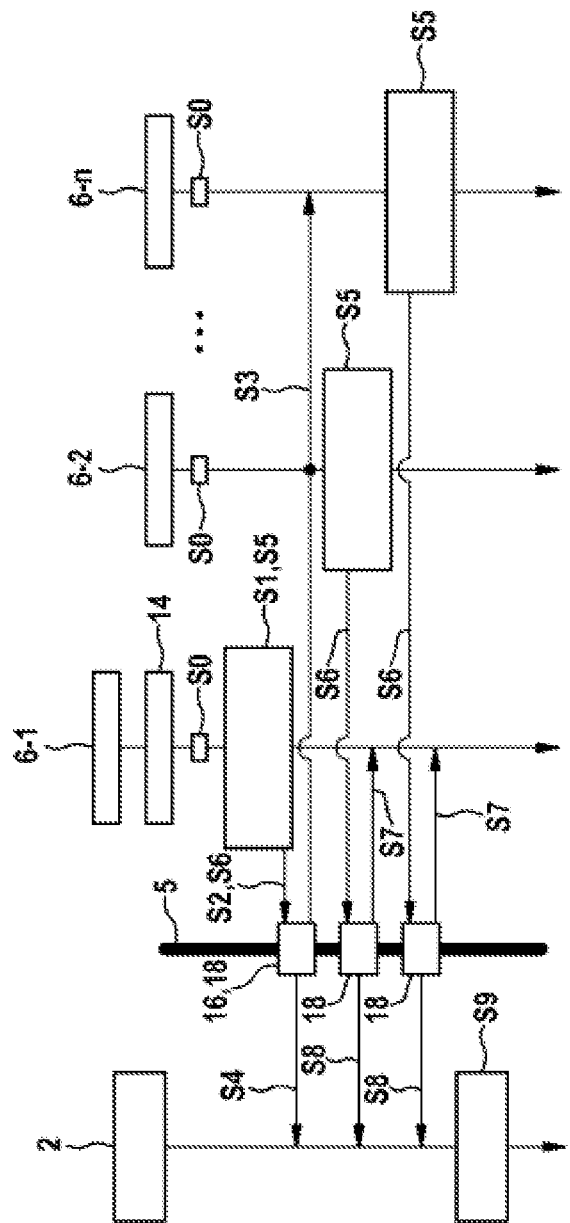
FIG. 2 shows a schematic illustration of a possible communication sequence between a main control device and a plurality of module control devices on a CAN bus.

FIG. 2 shows steps of a method for transmitting data between the main control device 2 and the module control devices 6-1, 6-2, . . . 6-n via the communications channel 5. In a step S0, the module control devices 6-1, 6-2, . . . 6-n determine their measurements of voltages, temperatures etc. For simplification, the description will refer only to the voltage below. After the system has been initiated, the module control device 6-1 is the reference module control device 14. In a step S1, the reference module control device 14 determines a reference measured value 16 of the module voltage. The reference module control device 14 determines the reference measured value 16 as a mean value of stored measured values or using a current measured value, for example. In a step S2, the reference module control device 14 transmits the reference measured value 16 on the communications channel 5. On account of the characteristics of the communications channel 5, all connected module control devices 6-1, 6-2, . . . 6-n can concomitantly read the data. In this manner, the further module control devices 6-2, . . . 6-n receive the current reference measured value 16 in a step S3. The main control device 2 also receives the current reference measured value 16 in a step S4. In a step S5, the further module control devices 6-2, . . . 6-n determine differential values 18 of their own measured values (determined in step S0) with respect to the reference measured value 16. In step S6, the further module control devices 6-2, . . . 6-n transmit the differential values 18 of their own measured values with respect to the reference measured value 16 on the communications channel 5. In step S7, the reference module control device 14 concomitantly reads the measured values from the further module control devices 6-2, . . . 6-n. In step S8, the main control device 2 receives the differential values 18. The reference measured value 16 and the differential values 18 of the measured values from the module control devices 6-1, 6-2, . . . 6-n with respect to the reference measured value 16 are now available to the main control device 2. The main control device 2 reconstructs the correct and complete measured values from these values in step S9. The method therefore runs without losses and the measurement accuracy is not impaired.

Provision may be made for only method steps S0, S5, S6, S8, S9 or S0, S5, S6, S7, S8, S9 to be repeated during operation of the battery. Provision may also be made for the reference measured value 16 to be newly determined each time or after a defined number of runs in step S1, in particular using the current measured values or only using the current measured values, that is to say for method steps S0, S1, S2, S3, S4, S5, S6, S7, S8 and S9 to be repeated.

Figure 3:
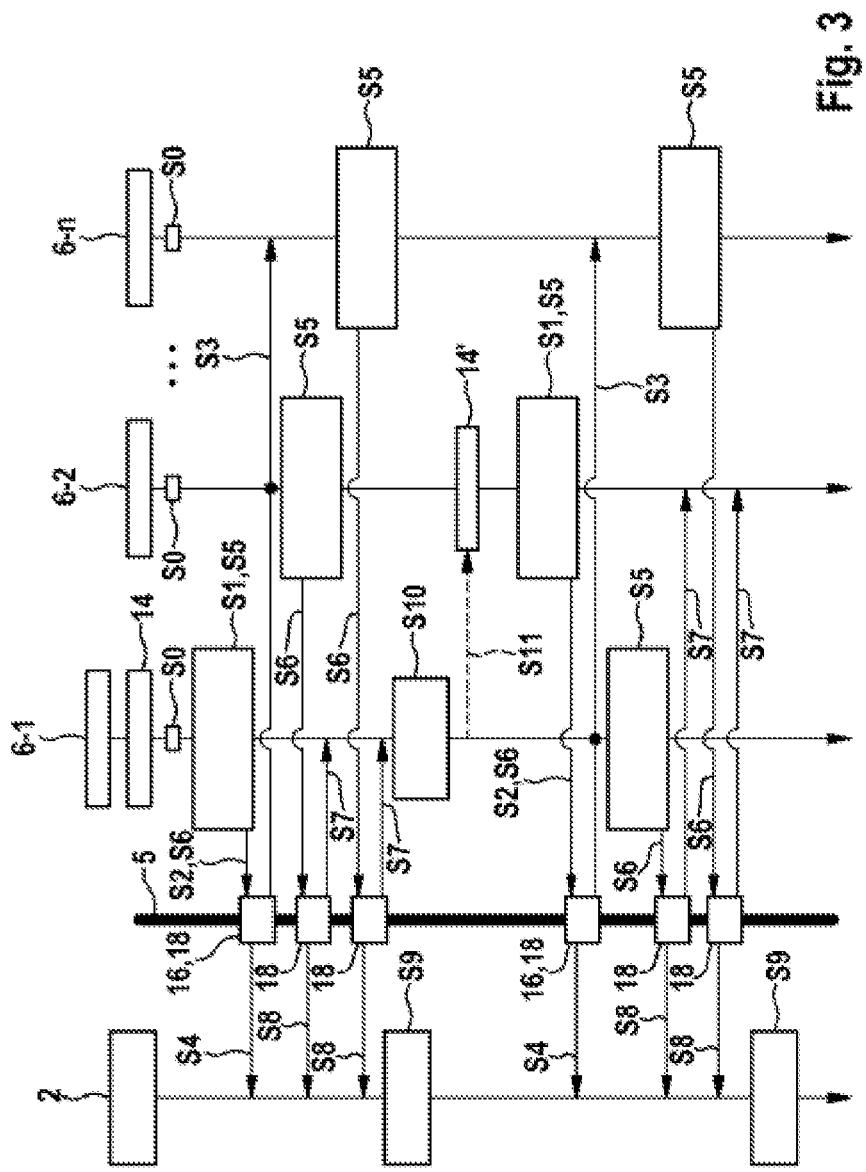
FIG. 3 shows a schematic illustration of a further possible communication sequence between a main control device and a plurality of module control devices on the CAN bus.

FIG. 3 shows a change of the reference module control device 14 from module control device 6-1 to module control device 6-2, for example. The change is due to the fact that the current reference module control device 14 (module control device 6-1) no longer provides a suitable reference measured value 16 since, for example, the battery cells of the reference module control device 14 are discharged on average more quickly or more slowly than the further module control devices 6-2, . . . 6-n owing to ageing.

The method illustrated in FIG. 3 initially runs like the method described in FIG. 2 until the main control device has reconstructed the measured values from the individual module control devices 6-1, 6-2, . . . 6-n in step S9. In step S10, the reference module control device 14 checks whether there are criteria for a change. The check can be carried out, for example, after expiry of a particular time or after determining a deviation state of the measured values from the reference module control device 14 with respect to the measured values from all module control devices 6-1, 6-2, . . . 6-n. In step S11, the reference module control device 14 selects a new reference module control device 14' from the group of all module control devices 6-1, 6-2, . . . 6-n, the module control device 6-2 in the example illustrated. In this case, provision may be made for the old reference module control device 14 to transmit the message relating to the definition of the new reference module control device 14' as a message on the communications channel 5 (not illustrated). All module control devices 6-2, . . . 6-n receive this message and take into account the fact that the reference module control device 14' has changed. From now on, the measurement cycles continue substantially unchanged, with the only modification that the other module control device 6-2, as the new reference module control device 14', specifies the reference measured value 16 for the measurements. The new reference measured value 16 can be determined, for example, by averaging the measured values from the reference module control device 14' or may consist only of the last measured value, the latter, by definition, being consistent with the measured values from all module control devices 6-1, 6-2, . . . 6-n.

FIG. 4 shows the exemplary profile of voltages at different battery modules over time. A first mean value 20 from a first sensor, a second mean value 22 from a second sensor and a third mean value 24 from a third sensor are illustrated. At the start, the first mean value 20 from the first sensor is the reference measured value 16 from the reference module control device, that is to say the reference module control device is that of the first sensor. At the time the reference module control device is newly determined using steps S10 and S11, as described with reference to FIG. 3. In the example illustrated, the first mean value 20 from the first sensor falls to a lesser extent than the mean values 22, 24 from the second and third sensors between times $t_0$ and $t_1$. At the time $t_1$, the old reference module control device, which is assigned to the first sensor, determines that the second mean value 22 from the second sensor is a more favorable reference measured value than the previous reference measured value. This is because the average deviation of all measured values from the mean value 22 from the second sensor is substantially lower than the average deviation of all measured values from the first mean value 20 from the first sensor at the time $t_1$. Therefore, the second mean value 22 from the second sensor is a favorable reference measured value and the old reference module control device determines, as the new reference module control device, that which is assigned to the second sensor. From this time on, the new reference module control device specifies the reference measured value 16 which, in the exemplary embodiment illustrated, is the second mean value 22 from the second sensor.

The invention is not restricted to the exemplary embodiments described here and the aspects highlighted therein. Rather, a multiplicity of modifications which are within the scope of the practice of a person skilled in the art are possible within the scope stated by the claims.

The invention claimed is:

1. A method for transmitting data in a battery management system (1) having at least one main control device (2) and a number of module control devices (6-1, 6-2, . . . , 6-n) which transmit measured values to the main control device (2) via a communications channel (5), one of the module control devices (6-1, 6-2, . . . , 6-n) being a reference module control device (14), the method comprising:
   a) transmitting (S2) by the reference module control device (14) a reference measured value (16) on the communications channel (5),
   b) determining (S5) by each of the module control devices (6-1, 6-2, . . . , 6-n) differential values (18) based on the difference between their own measured values and the reference measured value (16),
   c) transmitting (S6) by each of the module control devices (6-1, 6-2, . . . , 6-n) the differential values (18) on the communications channel (5), and
   d) reconstructing (S9) by the main control device (2) the module control devices' (6-1, 6-2, . . . , 6-n) measured values using the differential values and the reference measured value (16);
   wherein the reconstructed values are used to increase the service life, reliability, and/or safety of a battery system.

2. The method for transmitting data as claimed in claim 1, characterized in that, after expiry of a predetermined time, the reference module control device (14') is newly selected from the group of module control devices (6-1, 6-2, . . . , 6-n).

3. The method for transmitting data as claimed in claim 2, characterized in that a respective current reference module control device (14) selects (S11) the new reference module control device (14').

4. The method for transmitting data as claimed in claim 1, characterized in that the reference module control device (14') is newly selected from the group of module control devices (6-1, 6-2, . . . , 6-n) after determining a deviation state.

5. The method for transmitting data as claimed in claim 4, characterized in that the deviation state is determined (S10) by the reference module control device (14).

6. The method for transmitting data as claimed in claim 1, characterized in that the reference measured value (16) is determined by averaging stored measured values from the reference module control device (14).

7. The method for transmitting data as claimed in claim 1, characterized in that the measured values are cell voltages and/or temperatures.

8. A non-transitory computer readable medium having a computer program for carrying out one of the methods as claimed in claim 1, the computer program being executed on a programmable computer device.

9. The method for transmitting data as claimed in claim 1, characterized in that the reference measured value (16) is determined based on a current measured value from the reference module control device (14).

10. The method for transmitting data as claimed in claim 1, characterized in that the measured values are cell voltages.

11. The method for transmitting data as claimed in claim 1, characterized in that the measured values are temperatures.

12. A battery management system (1) having at least one main control device (2) and a plurality of module control devices (6-1, 6-2, . . . , 6-n) which transmit measured values to the main control device (2) via a communications channel (5), characterized in that one of the module control devices (6-1, 6-2, . . . , 6-n) is a reference module control device (14), the plurality of module control devices (6-1, 6-2, . . . , 6-n) determining and transmitting differential values (18) calculated from the difference between of their own measured values and the reference measured value (16) from the reference module control device (14), and the main control device (2) having determining the module control devices' (6-1, 6-2, . . . , 6-n) measured values using the reference measured value (16) and the differential values (18); wherein the determined measured values are used to increase the service life, reliability and/or safety of a battery system.

13. A battery having a battery management system (1) as claimed in claim 12.

14. A motor vehicle having a battery as claimed in claim 13.

* * * * *